United States Patent
Aude (10) Patent No.: US 7,518,421 B1
(45) Date of Patent: Apr. 14, 2009

(54) SYSTEM AND METHOD FOR PROVIDING A KICK BACK COMPENSATED CHARGE PUMP WITH KICKER CAPACITOR

(75) Inventor: Arlo Aude, Atlanta, GA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/305,674

(22) Filed: Dec. 16, 2005

(51) Int. Cl.
*H03L 7/06* (2006.01)

(52) U.S. Cl. .................. 327/157; 327/148; 327/536; 363/59; 363/60

(58) Field of Classification Search .......... 327/148, 327/156, 157, 158, 382; 331/1 R, 17, 25; 375/373–376
See application file for complete search history.

(56) References Cited

U.S. PATENT DOCUMENTS 6,320,435 B1 * 11/2001 Tanimoto ............... 327/156
6,466,078 B1 * 10/2002 Stiff ........................ 327/536
6,891,411 B2 * 5/2005 Lever ....................... 327/148
6,989,698 B2 * 1/2006 Jeong ...................... 327/157
2006/0160492 A1 * 7/2006 Jensen ....................... 455/76

* cited by examiner

*Primary Examiner*—Long Nguyen
*Assistant Examiner*—Ryan C Jager (57) ABSTRACT

A kick back compensated charge pump circuit with kicker capacitor is disclosed. The charge pump circuit comprises a pump up circuit that comprises a first PMOS transistor and a second PMOS transistor in a cascode configuration and coupled to a first kicker capacitor. The charge pump circuit also comprises a pump down circuit that comprises a first NMOS transistor and a second NMOS transistor in a cascode configuration and coupled to a second kicker capacitor. The kicker capacitors increase the speed of the charge pump circuit by charging and discharging a gate to source capacitance (CGS) of the pump up circuit and of the pump down circuit of the charge pump circuit.

21 Claims, 9 Drawing Sheets

SYSTEM AND METHOD FOR PROVIDING A KICK BACK COMPENSATED CHARGE PUMP WITH KICKER CAPACITOR

TECHNICAL FIELD

The present invention is generally directed to charge pumps for use in phase locked loop circuits and more specifically to a kick back compensated charge pump with a kicker capacitor.

BACKGROUND

Phase locked loops are used in a wide variety of applications. For example, phase locked loops are routinely used in communication devices to provide clock signals to various components of the devices. A conventional phase locked loop includes a charge pump that controls a reference voltage used by an oscillator to produce an output signal. Conventional charge pumps typically generate "up" and "down" currents to control the reference voltage.

A problem with conventional phase locked loops is that the output signals suffer from unwanted spurious signals. These spurious signals can negatively affect the components that use the output signals. For example, communication devices often use phase locked loops to transmit and receive data. Unwanted spurious signals may disturb data being received and introduce unwanted spectral content into data being transmitted.

Charge pumps may often exhibit several different types of problems. For example, charge pumps may operate at slow speeds, have a low output impedance, and generate kick-back noise. It would therefore be advantageous in the art to have an improved charge pump circuit that does not exhibit slow speed, low output impedance, and kick-back noise.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

The term "controller" means any device, system, or part thereof that controls at least one operation. A controller may be implemented in hardware, software, firmware, or combination thereof. It should be noted that the functionality associated with any particular controller may be centralized or distributed, whether locally or remotely.

Definitions for certain words and phrases are provided throughout this patent document, those of ordinary skill in the art should understand that in many, if not most instances, such definitions apply to prior uses, as well as to future uses, of such defined words and phrases.

BRIEF DESCRIPTION OF THE DRAWINGS

For a more complete understanding of this disclosure and its features, reference is now made to the following description taken in conjunction with the accompanying drawings, in which.

DETAILED DESCRIPTION OF THE INVENTION

FIGS. 1 through 12, discussed below, and the various embodiments used to describe the principles of the present invention in this patent document are by way of illustration only and should not be construed in any way to limit the scope of the invention. Those skilled in the art will understand that the principles of the present invention may be implemented in any type of suitably arranged electronic device.

Figure 1:
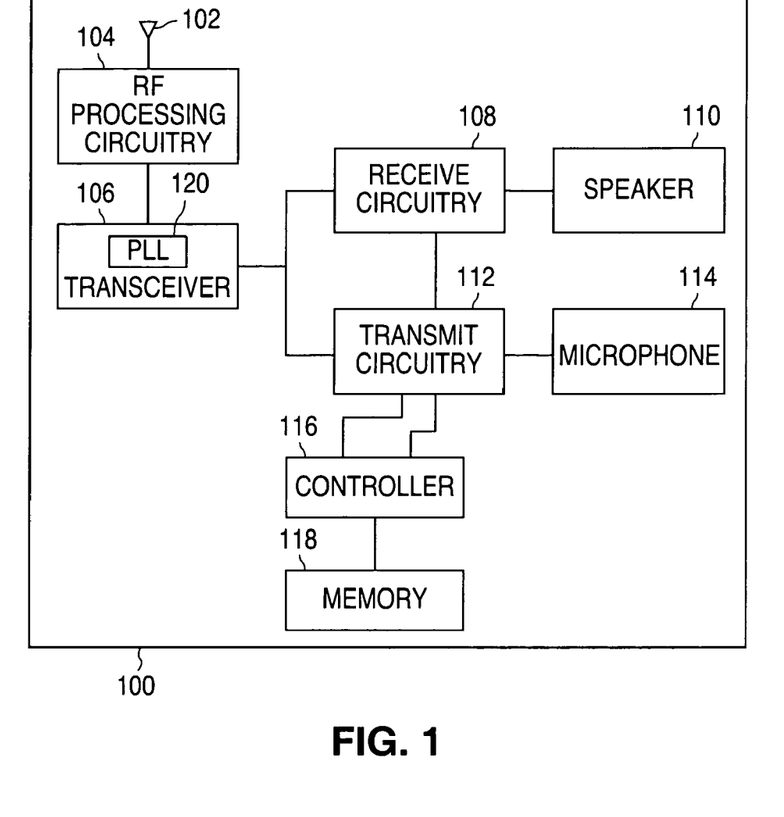
FIG. 1 illustrates an exemplary wireless device constructed in accordance with the principles of the invention.

FIG. 1 illustrates an exemplary wireless device 100 constructed in accordance with the principles of the invention. The wireless device 100 illustrated in FIG. 1 comprises one advantageous embodiment of the invention. It is understood that the present invention is not limited to the embodiment shown in FIG. 1. The present invention could also be used in other devices without departing from the scope of this disclosure. In addition, the wireless device 100 in FIG. 1 has been simplified for ease of illustration and explanation. Other or additional components could be included in wireless device 100.

In the illustrated embodiment, the wireless device 100 comprises an antenna 102. The antenna 102 facilitates the communication of information over a wireless interface. The antenna 102 may represent any suitable structure that is capable of facilitating the transmission or reception of wireless signals. As a particular example, the antenna 102 may support the transmission and reception of radio frequency signals.

Radio frequency (RF) processing circuitry 104 is coupled to the antenna 102. In this document, the term "couple" and its derivative terms refer to any direct or indirect communication between two or more components, whether or not those components are in physical contact with one another. The radio frequency (RF) processing circuitry 104 processes the signals transmitted or received by antenna 102. As particular examples, the radio frequency (RF) processing circuitry 104 could comprise one or more low-noise amplifiers, mixers, filters, and power amplifiers.

A transceiver 106 is coupled to the RF processing circuitry 104. The transceiver 106 may receive incoming signals received by the antenna 102 and down-convert the signals to generate baseband or intermediate frequency signals. The transceiver 106 may also receive baseband signals or intermediate frequency signals and up-convert the signals for transmission by the antenna 102. The transceiver 106 could comprise any hardware, software, firmware, or combination thereof for facilitating communication using the antenna 102. As a particular example, the transceiver 106 could comprise a transmitter and a receiver.

Receive circuitry 108 is coupled to the transceiver 106. The receive circuitry 108 receives and processes incoming signals received by the wireless device 100. For example, the receive circuitry 108 may receive the baseband or intermediate frequency signals produced by the transceiver 106 and process the signals to extract information contained in the signals. The receive circuitry 108 may comprise any hardware, software, firmware, or combination thereof for processing incoming signals, such as a filter or decoder. In the illustrated example, the incoming signals represent voice information, and the extracted voice information may be provided to a speaker 110 for presentation to a user.

Transmit circuitry 112 is coupled to the transceiver 106. The transmit circuitry 112 receives and processes outgoing signals for transmission by the wireless device 100. For example, the transmit circuitry 112 may receive voice information and process the information to produce baseband or intermediate frequency signals. The baseband or intermediate frequency signals may then be provided to the transceiver 106. The transmit circuitry 112 may comprise any hardware, software, firmware, or combination thereof for processing outgoing signals, such as a filter or an encoder. In the illustrated example, the outgoing signals may comprise voice information collected by a microphone 114.

A controller 116 is connected to the receive circuitry 108 and the transmit circuitry 112. The controller 116 controls the operation and behavior of the wireless device 100. For example, the controller 116 could allow a user to mute the wireless device 100 so that no voice information is transmitted by the wireless device 100. In this example, the controller 116 may instruct the transmit circuitry 112 to stop transmitting information when the wireless device 100 has been muted. The controller 116 could represent any suitable controller, such as a processor. The logic executed by the controller 116 could be stored in a memory 118, which may represent any suitable storage and retrieval device or devices. In other embodiments, the controller 116 and the memory 118 could be omitted from the wireless device 100.

In one aspect of operation, the transceiver 106 includes a phase locked loop (PLL) 120 of the present invention. The phase locked loop 120 comprises a charge pump 208 of the present invention (shown in FIG. 1 and in FIG. 3) that generates "up" and "down" currents that control a reference voltage. The reference voltage controls the frequency of an output signal generated by an oscillator.

Although FIG. 1 illustrates one example of a wireless device 100, various changes may be made to the wireless device shown in FIG. 1. For example, while FIG. 1 illustrates a wireless device 100 providing voice services, other one-way or multi-way wireless or wireline communication devices or other devices could use the phase locked loop 120. As a particular example, other interfaces may be used in place of the antenna 102, and one of the receive circuitry 108 and transmit circuitry 112 could be omitted. Also, various components could be combined or omitted or additional components can be added to the device 100 according to particular needs. In addition, the phase locked loop 120 of the present invention may be used in any other circuit, device, or system.

Figure 2:
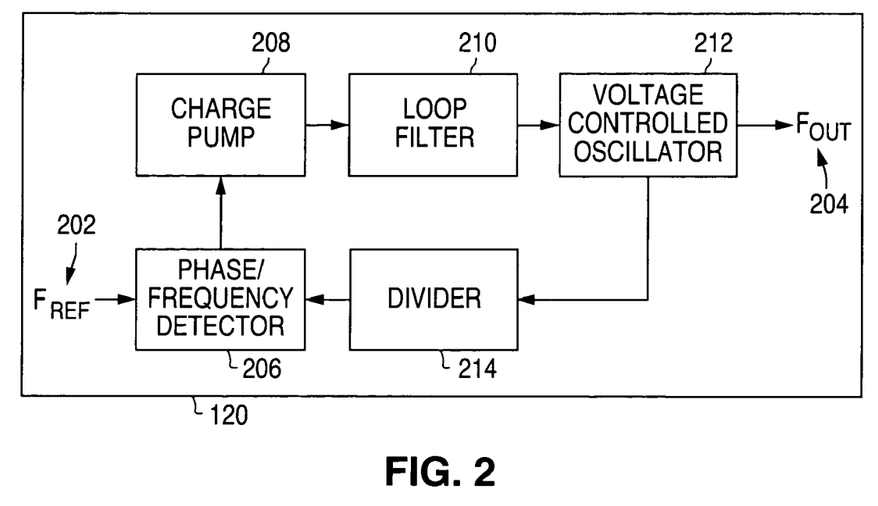
FIG. 2 illustrates an exemplary phase locked loop constructed in accordance with the principles of the invention.

FIG. 2 illustrates an exemplary phase locked loop 120 according to the principles of the present invention. As previously mentioned, the phase locked loop 120 may be used in the wireless device 100 that is shown in FIG. 1 or in any other suitable electronic device. Other embodiments of the phase locked loop 120 could be used without departing from the scope of the present invention.

The phase locked loop 120 is capable of receiving an input reference signal ($F_{REF}$) 202 and producing an output signal ($F_{OUT}$) 204. In the illustrated example, the phase locked loop 120 includes a phase-frequency detector 206. The phase-frequency detector 206 identifies a phase difference between the reference signal 202 and a signal provided by a frequency divider 214. Based on whether the reference signal 202 leads or trails the output signal 204, the phase-frequency detector 206 outputs either an "up" or "down" signal. The phase-frequency detector 206 includes any hardware, software, firmware, or combination thereof for identifying a phase difference between two or more inputs.

Figure 3:
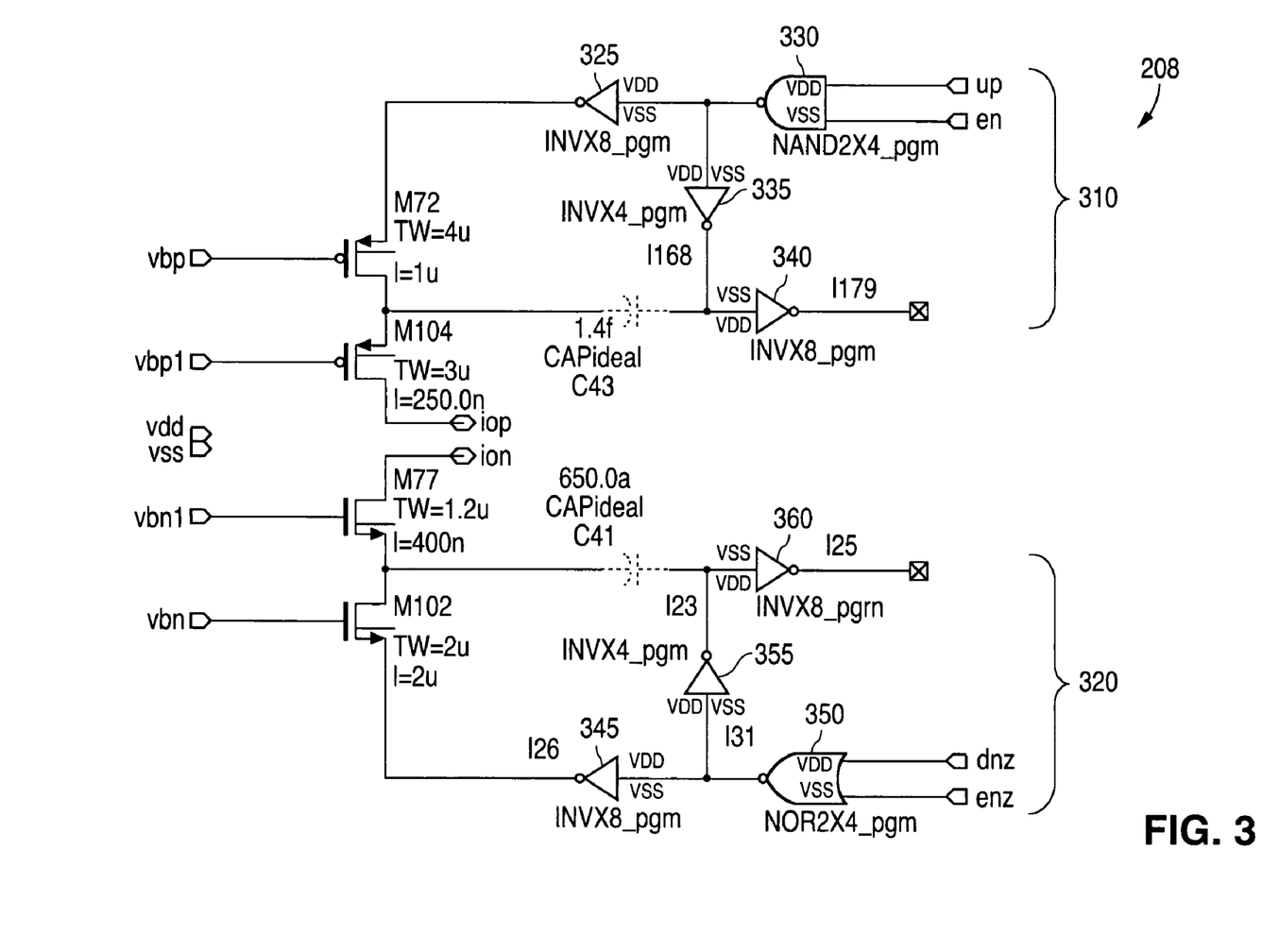
FIG. 3 illustrates an exemplary charge pump constructed in accordance with the principles of the invention.

A charge pump 208 of the present invention is coupled to the phase-frequency detector 206. The charge pump 208 receives the "up" and "down" signals from the phase-frequency detector 206. The charge pump 208 then sources or sinks a current to or from a loop filter 210, depending on whether the "up" or "down" signal is being received by the charge pump 208. In particular, the charge pump 208 sources an "up" current to the loop filter 210 when an "up" signal is received from the phase-frequency detector 206, which increases the voltage stored on the loop filter 210. The charge pump 208 sinks a "down" current from the loop filter 210 when a "down" signal is received from the phase-frequency detector 206, which decreases the voltage stored on the loop filter 210. In this way, the charge pump 208 controls the voltage stored on the loop filter 210. The charge pump 208 includes any structure capable of controlling a voltage stored on a loop filter 210. One example of a charge pump 208 is shown in FIG. 3, which is described below.

The loop filter 210 is coupled to the charge pump 208. The loop filter 210 is capable of storing a voltage that is controlled by the charge pump 208. The loop filter 210 represents any suitable filter, such as a low-pass filter or a band-pass filter.

A voltage controlled oscillator 212 is coupled to the loop filter 210. The oscillator 212 is capable of producing the output signal 204. For example, the frequency of the output signal 204 may be controlled by the voltage stored on the loop filter 210. The oscillator 212 includes any suitable oscillator capable of generating an output signal 204.

A frequency divider 214 is coupled to the oscillator 212 and to the phase-frequency detector 206. The divider 214 is capable of providing the phase-frequency detector 206 with an altered version of the output signal 204. For example, the divider 214 may reduce the frequency of the output signal 204 by a factor of n, where n represents any suitable value. The divider 214 then provides the altered output signal to the phase-frequency detector 206, which uses the altered output signal to generate an "up" or "down" signal for the charge pump 208. The divider 214 includes any hardware, software, firmware, or combination thereof for altering the frequency of a signal.

The charge pump 208 is capable of producing highly accurate "up" and "down" currents over a large output voltage range. In particular, the charge pump 208 generates "up" and "down" currents having a smaller mismatch (or no mismatch). This may help to increase the accuracy of the charge pump 208 and may allow the phase locked loop 120 to generate an output signal 204 having fewer or no unwanted spurious signals. This may also allow the wireless device 100 or other device in which the phase locked loop 120 operates to more effectively use the output signal 204.

Although FIG. 2 illustrates one example of a phase locked loop 120, various changes may be made to the phase locked loop 120 that is shown in FIG. 2. For example, the functional division shown in FIG. 2 is for illustration only. Various components could be combined, omitted, or further subdivided and additional components could be added according to particular needs.

FIG. 3 illustrates an exemplary charge pump 208 according to one embodiment of the present invention. The charge pump 208 illustrated in FIG. 3 may be used in the phase locked loop 120 of FIG. 2. Other embodiments of the charge pump 208 may be used without departing from the scope of the present invention.

In the illustrated example, the charge pump 208 comprises a pump up circuit 310 and a pump down circuit 320. The pump up circuit 310 will be described first. Pump up circuit 310 comprises a first p-type metal oxide semiconductor (PMOS) transistor M72 coupled in cascode configuration with a second PMOS transistor M104. The gate of first PMOS transistor M72 is coupled to a control voltage signal "vbp" and the gate of second PMOS transistor M104 is coupled to a control voltage signal "vbp1". The drain of second PMOS transistor 104 is coupled to a current output node "iop".

A first end of a first kicker capacitor C43 is coupled to the drain of first PMOS transistor M72 and to the source of second PMOS transistor M104. In one advantageous embodiment of the invention, the first kicker capacitor C43 has a value of capacitance that is sufficient to produce the sharpest rise/fall times with symmetrical or minimum overshoot/undershoot.

The source of first PMOS transistor M72 is coupled to the output of a first inverter 325. The input of first inverter 325 is coupled to an output of NAND gate 330. A first input of NAND gate 330 is coupled to an "up" control signal and a second input of NAND gate 330 is coupled to an "enable" control signal. An input of a second inverter 335 is coupled to the output of NAND gate 330 and to the input of first inverter 325. The output of second inverter 335 is coupled to a second end of first kicker capacitor C43 and to the input of a third inverter 340.

The pump down circuit 320 will now be described. Pump down circuit 320 comprises a first n-type metal oxide semiconductor (NMOS) transistor M77 coupled in cascode configuration with a second NMOS transistor M102. The gate of first NMOS transistor M77 is coupled to a control voltage signal "vbn1" and the gate of second NMOS transistor M102 is coupled to a control voltage signal "vbn". The drain of first NMOS transistor 77 is coupled to a current output node "ion".

A first end of a second kicker capacitor C41 is coupled to the drain of second NMOS transistor M102 and to the source of first NMOS transistor M77. In one advantageous embodiment of the invention, the second kicker capacitor C41 has a value of capacitance that is sufficient to produce the sharpest rise/fall times with symmetrical or minimum overshoot/undershoot.

The source of second NMOS transistor M102 is coupled to the output of a fourth inverter 345. The input of fourth inverter 345 is coupled to an output of NOR gate 350. A first input of NOR gate 350 is coupled to a "dnz" control signal and a second input of NOR gate 350 is coupled to an "enable z" control signal. An input of a fifth inverter 355 is coupled to the output of NOR gate 350 and to the input of fourth inverter 345. The output of fifth inverter 355 is coupled to a second end of second kicker capacitor C41 and to the input of a sixth inverter 360.

The PMOS transistors (M72 and M104) and the NMOS transistors (M77 and M102) are sized to have identical areas to eliminate (to a first order) GCD clock feed-through, but their aspect ratios are adjusted to account for mobility differences. The kicker capacitor C43 in the pump up circuit 310 and the kicker capacitor C41 in the pump down circuit 320 significantly improve the speed of the rise and fall times of the current signals and significantly reduce discharge trails.

Although FIG. 3 illustrates one example of a charge pump 208 of the present invention, various changes may be made to the charge pump 208 that is shown in FIG. 3. For example, other or additional components could be used in the charge pump 208. The charge pump 208 may also be used in any suitable environment. As a particular example, the charge pump 208 may be used in a low supply voltage closed-loop phase locked loop or other phase locked loop.

Figure 4:
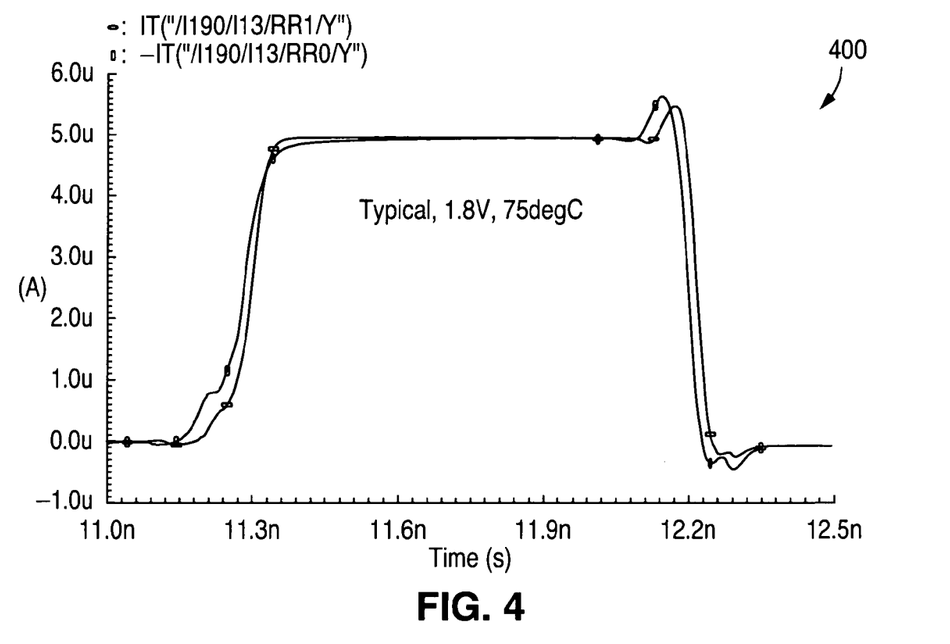
FIG. 4 illustrates a graph of current versus time showing the matching of up and down currents of a charge pump under typical operating conditions.

FIG. 4 illustrates a graph 400 of current versus time showing the matching of up and down currents of a charge pump under typical operating conditions. The charge pump voltage is one and eight tenths volts (1.8 V) and the temperature is seventy five degrees Celsius (75° C.). The value of current rises from a zero value to a value of approximately five microamperes (5.0 μa). FIG. 4 shows that approximately one nanosecond (1.0 ns) later the current value drops back down to the zero level of current.

Figure 5:
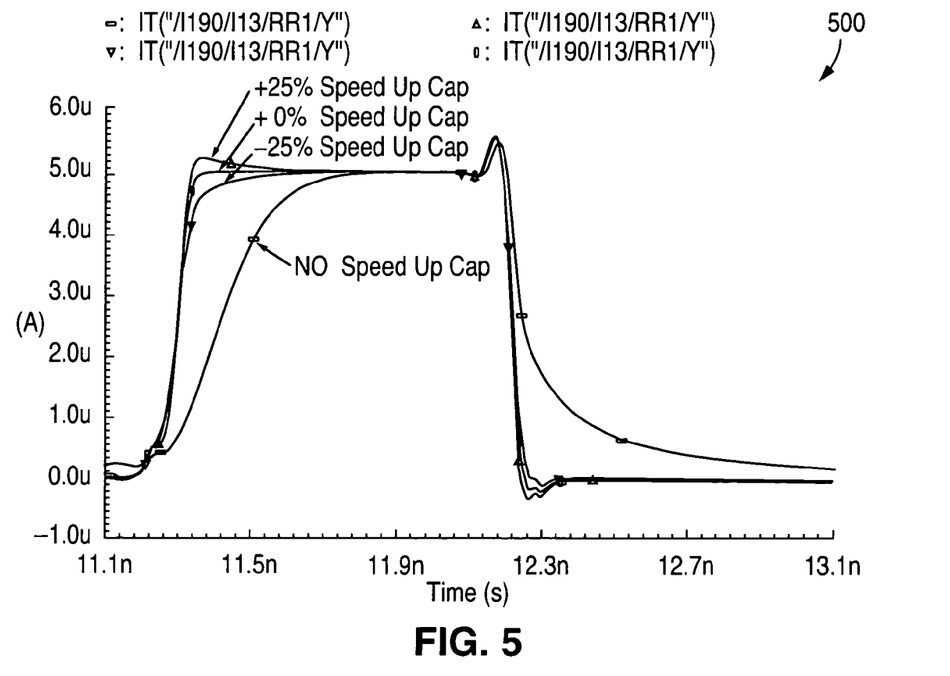
FIG. 5 illustrates a graph of current versus time showing the effect of a kicker capacitor on the up and down currents of a charge pump of the present invention.

FIG. 5 illustrates a graph 500 of current versus time showing the effect of a kicker capacitor on the down currents of a charge pump of the present invention. The kicker capacitor is also referred to as a "Speed Up Cap" in FIG. 5.

If there is no kicker capacitor present, then the speed of the rise in the value of current (and the speed of the fall in the value of current) is very slow. This is shown in FIG. 5 in the line designated "NO Speed Up Cap." The very slow rise (and the very slow fall) in current value is due to the fact that the cascode configuration of the transistors begins in an "off" condition and requires a certain amount of time in order to charge up the gate to source capacitance (CGS).

Properly sizing the kicker capacitor allows the digital control voltage almost instantly do most of the charging of the node. Any error in the amount of excess charge will be removed by the active cascode configuration of the transistors.

Discharge of the gate to source capacitance (CGS) also happens almost instantly due to the fact that the kicker capacitor removes the charge from the cascode configuration's gate to source capacitance (CGS). Any error in the amount of eliminated charge is compensated for by the bias circuit that drives the gate voltage of the cascode configuration.

Small variations in the size of the kicker capacitor (e.g. plus or minus twenty five percent (+/−25%) cause small changes in the initial charge pump current as a minor overshoot (or as a minor undershoot). However, the small variations do not affect the magnitude of the final charge pump current. This phenomenon is illustrated by the lines in FIG. 5 that are designated "−25% Speed Up Cap", "+0% Speed Up Cap," and "+25% Speed Up Cap."

Figure 6:
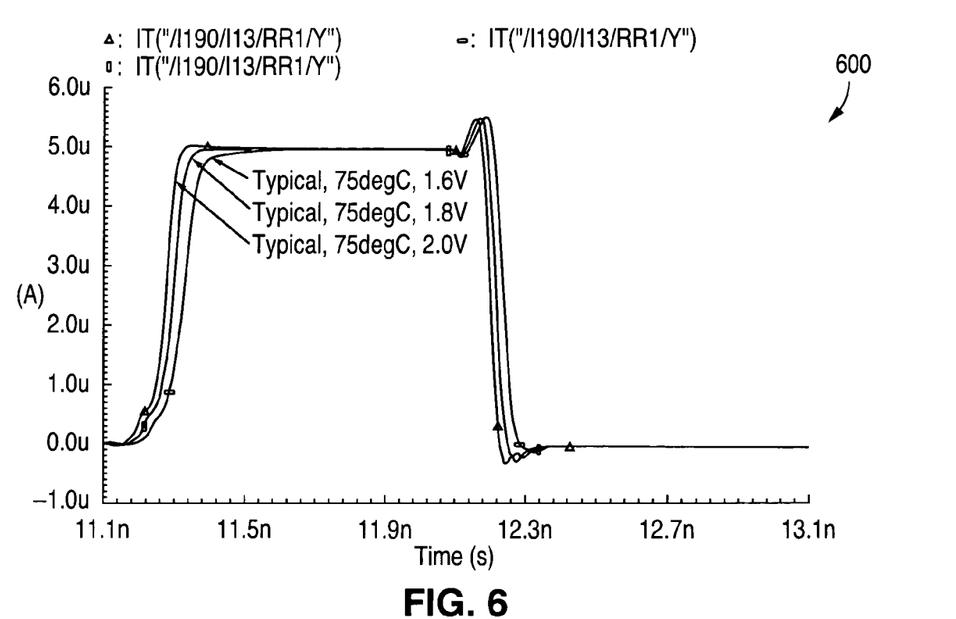
FIG. 6 illustrates a graph of current versus time showing the matching of up and down currents of a charge pump for various values of supply voltage.

FIG. 6 illustrates a graph 600 of current versus time showing the variation of down currents of a charge pump for various values of supply voltage. FIG. 6 shows the effect on the charge pump current of varying the supply voltage. The temperature for each of the three graphs of current is seventy five degrees Celsius (75° C.). The three values of supply voltage shown in FIG. 6 are one and six tenths volts (1.6 V), one and eight tenths volts (1.8 V), and two volts (2.0 V).

The amount of charge that is injected by the kicker capacitor is directly dependent upon the supply voltage. As shown in FIG. 6, the overshoot and the undershoot of the values of current are minimally affected by the change in supply voltage. The variation in supply voltage shown in FIG. 6 is approximately plus or minus ten percent (+/−10%). The phenomenon of the variation of the value of current with respect to changes in the value of the supply voltage is similar to the phenomenon of the variations of the value of current with respect to changes in the value of the kicker capacitor.

Figure 7A:
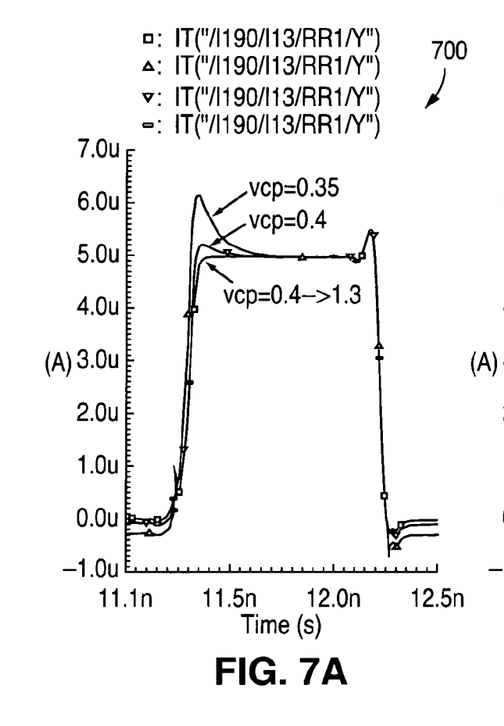
FIGS. 7A and 7B illustrate graphs of current versus time showing the matching of up and down currents of a charge pump for various values of output voltage for an up and down type charge pump, respectively.
Figure 7B:
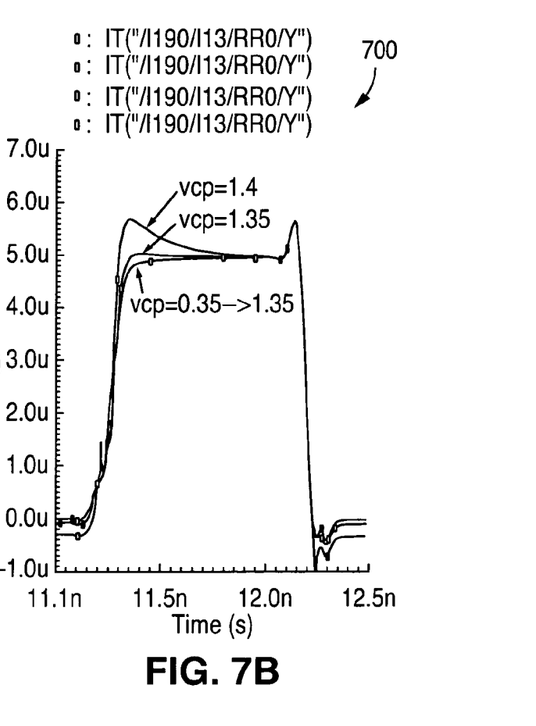

FIGS. 7A and 7B illustrate graphs 700 of current versus time showing the matching and variations of up and down currents of a charge pump for various values of charge pump output voltage. The cascode configuration of the transistors of the charge pump for both the up an down currents are constant over the range of approximately one volt (1.0 V). Above or below this range of approximately one volt (1.0 V), the cascode configuration of the transistors of the charge pump goes out of saturation. Then the charge on the kicker capacitor is directly injected into the output node ("iop" or "ion").

When the injection of charge into the output node occurs, the additional charge only affects the overshoot or undershoot of the value of current. The injection of charge into the output node does not affect the amount of the final charge.

Figure 8A:
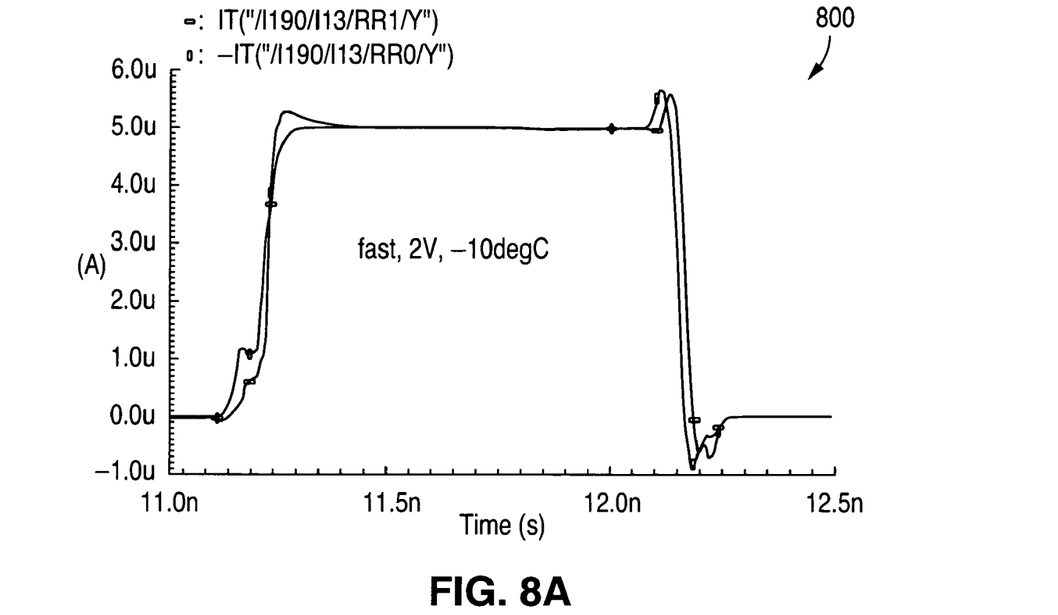
FIGS. 8A through 8D illustrate graphs of current versus time showing the matching of up and down currents of a charge pump for four corner extremes.
Figure 8B:
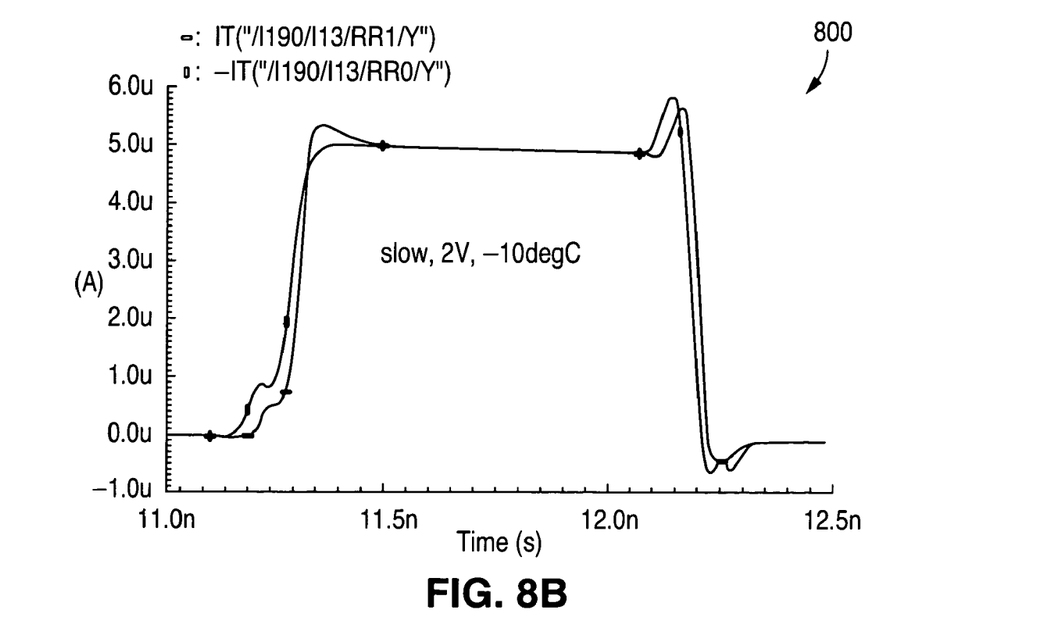
Figure 8C:
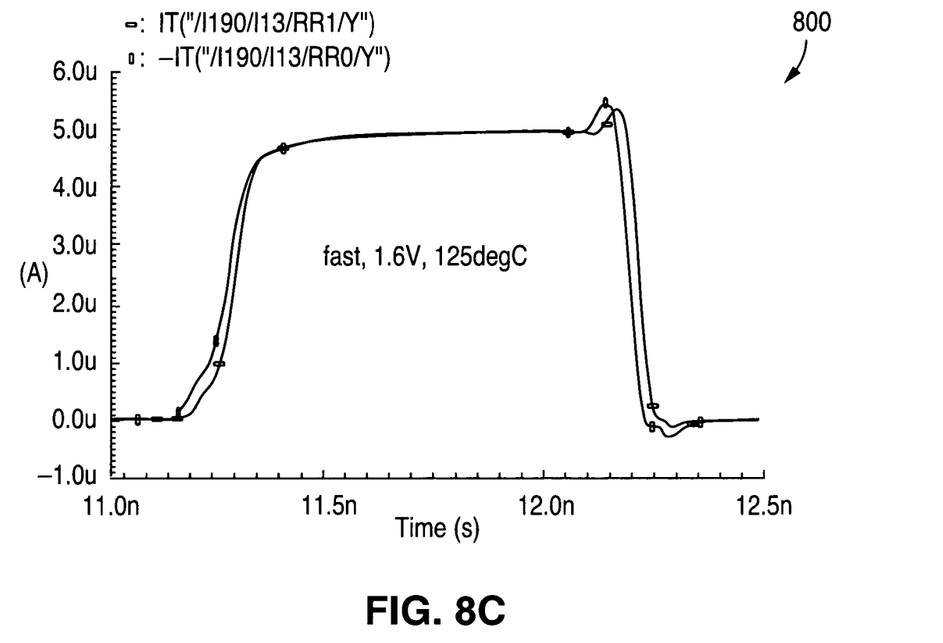
Figure 8D:
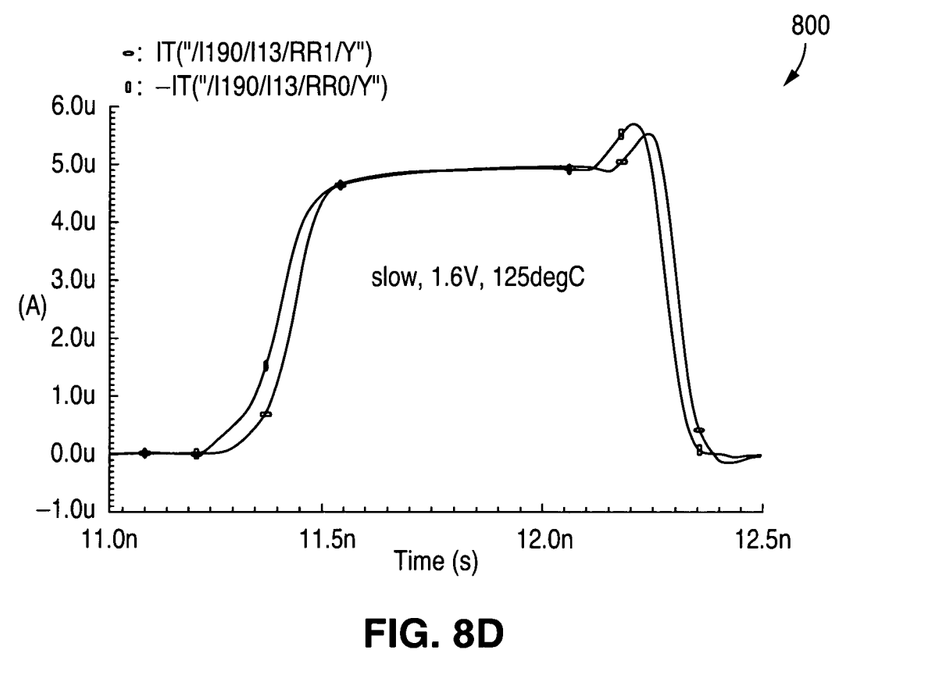

FIGS. 8A through 8D illustrate graphs 800 of current versus time showing the matching of up and down currents of a charge pump for four corner extremes. In each case the charge pump voltage is set the eight hundred millivolts (800 mV). FIG. 8A illustrates the current versus time for the conditions: fast, two volts (2.0 V), and minus ten degrees Celsius (−10° C.). FIG. 8B illustrates the current versus time for the conditions: slow, two volts (2.0 V), and minus ten degrees Celsius (−10° C.). FIG. 8C illustrates the current versus time for the conditions: fast, one and six tenths volts (1.6 V), and one hundred twenty five degrees Celsius (+125° C.). FIG. 8D illustrates the current versus time for the conditions: slow, one and six tenths volts (1.6 V), and one hundred twenty five degrees Celsius (+125° C.).

Figure 9A:
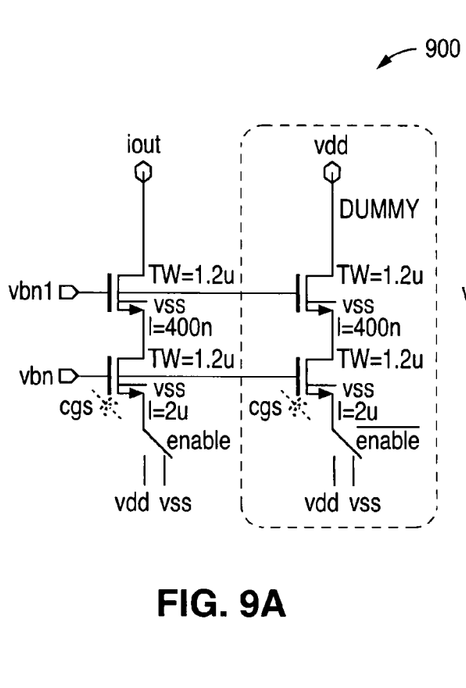
FIGS. 9A through 9C illustrate diagrams showing a conceptual operation of a pump down circuit of a charge pump circuit of the present invention.
Figure 9B:
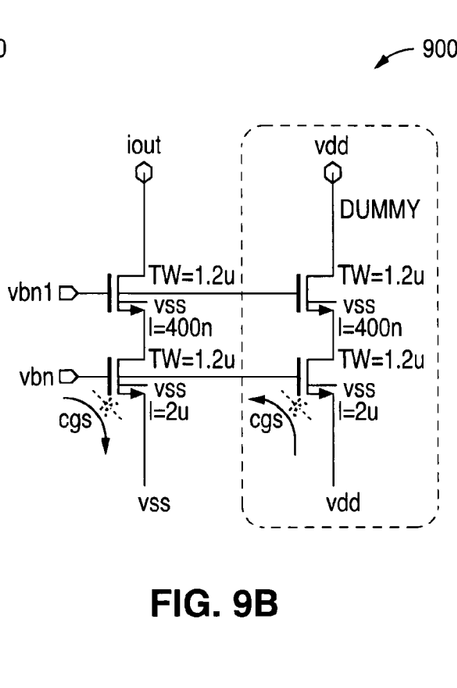
Figure 9C:
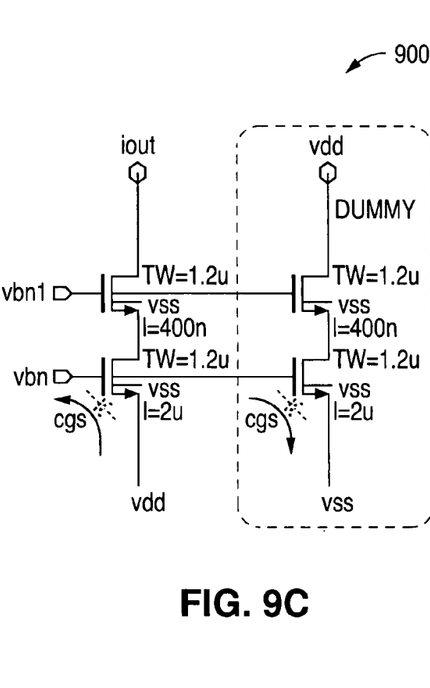

FIGS. 9A through 9C illustrate diagrams 900 showing a conceptual operation of the pump down circuit of the charge pump circuit of the present invention. As shown in FIGS. 9A through 9C, the pump down circuit may be conceived as using a secondary charge pump to cancel kick-back charge of the switching current source. The source of the current source is pulled either to the voltage "vdd" to enable the pump down circuit, or to the voltage "vss" to disable the pump down circuit. FIG. 9B illustrates the current source pulled to the voltage "vss" and the pump down circuit disabled. FIG. 9C illustrates the current source pulled to the voltage "vdd" the pump down circuit enabled.

The large change in voltage causes the gate to source capacitance (CGS) of the current source to see a large change in the charge that it stores. Without the dummy circuit, the bias circuit that drives the node "vbn" would have to supply the charge. Operating the dummy charge pump with an inverted enable phase relative to the main charge pump causes the charge requirements of the main charge pump and the dummy charge pump to cancel. Therefore, the node "vbn" sees a very small disturbance, and the output current at node "iout" responds significantly faster and more accurately.

Figure 10:
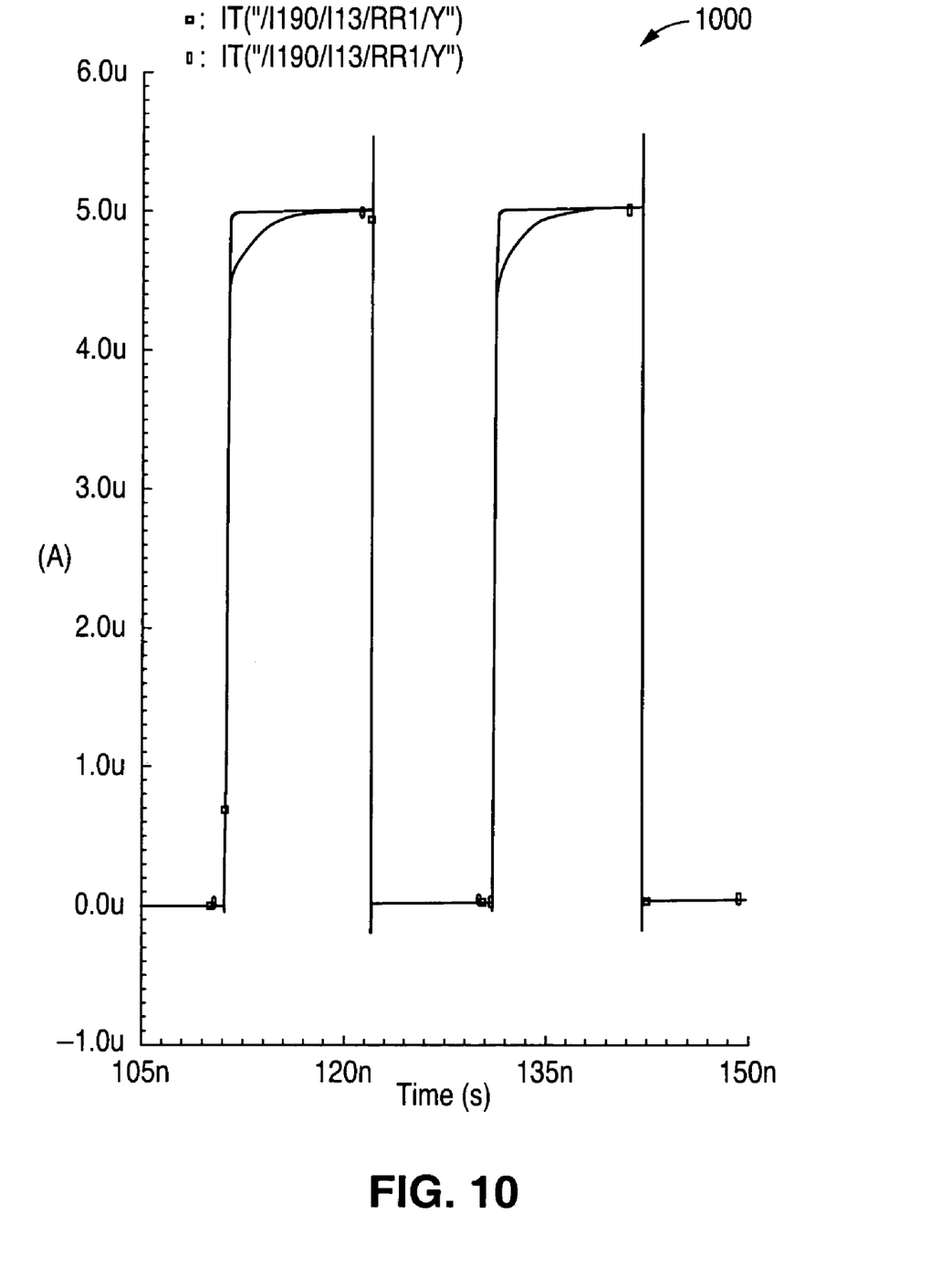
FIG. 10 illustrates a graph of current versus time showing the output current of the pump down circuit of the charge pump circuit of the present invention with and without a dummy charge pump enabled.

FIG. 10 illustrates a graph 1000 of current versus time showing the output current of the pump down circuit of the charge pump circuit of the present invention with and without a dummy charge pump enabled. When the dummy charge pump is disabled (i.e., there is no kicker capacitor present), then the speed of the rise in the value of current is slow to reach the maximum value of current. The slow rise in current value is due to the fact that the cascode configuration of the transistors begins in an "off" condition and requires a certain amount of time in order to charge up the gate to source capacitance (CGS).

Figure 11:
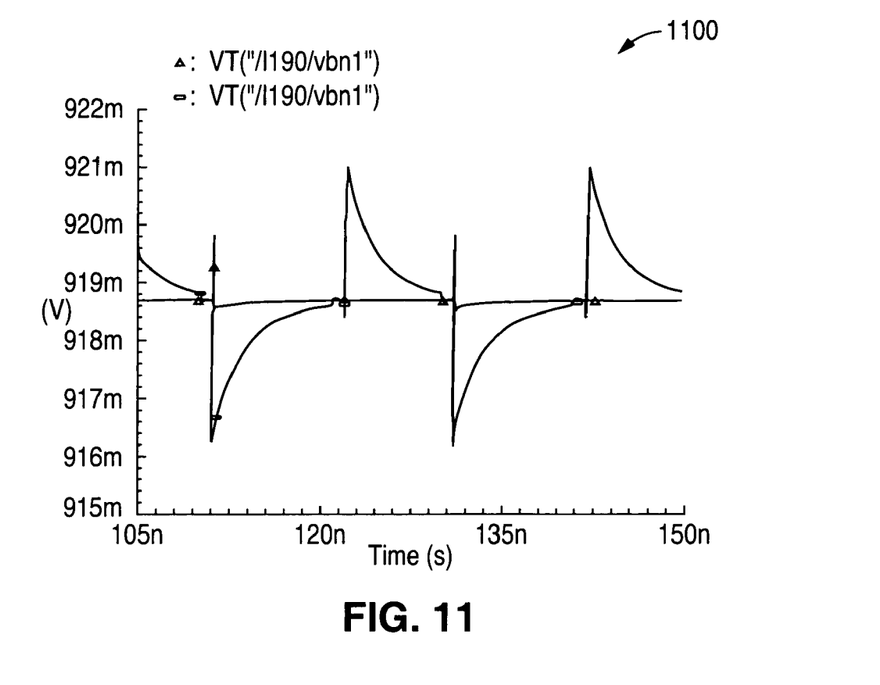
FIG. 11 illustrates a graph of voltage versus time showing the cascode gate voltage of the pump down circuit of the charge pump circuit of the present invention with and without a dummy charge pump enabled.
Figure 12:
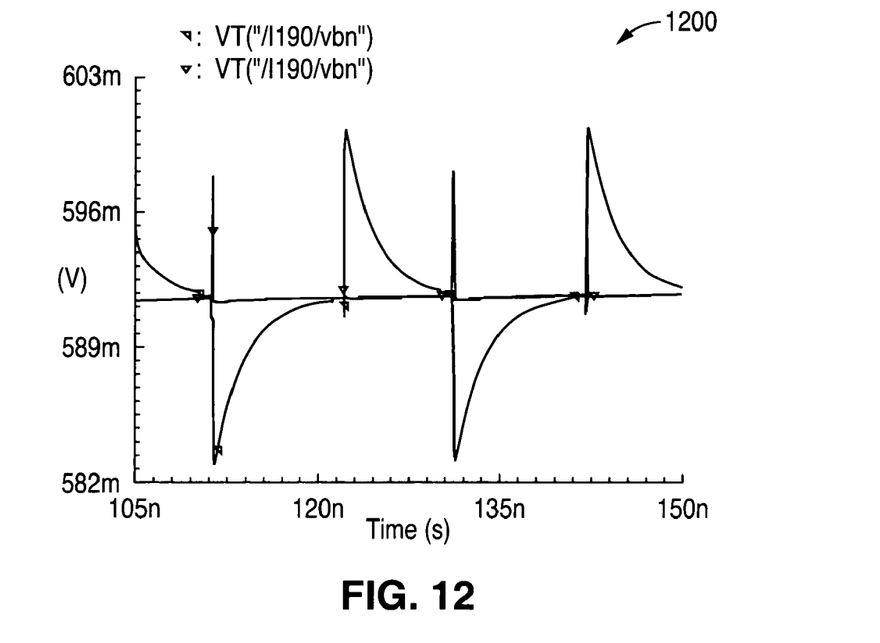
FIG. 12 illustrates a graph of voltage versus time showing the current source gate node voltage of the pump down circuit of the charge pump circuit of the present invention with and without a dummy charge pump enabled.

FIG. 11 illustrates a graph 1100 of voltage versus time showing the cascode voltage of the pump down circuit of the charge pump circuit of the present invention with and without a dummy charge pump enabled. FIG. 12 illustrates a graph 1200 of voltage versus time showing the current source gate node voltage of the pump down circuit of the charge pump circuit of the present invention with and without a dummy charge pump enabled.

FIG. 11 and FIG. 12 show that when the dummy charge pump is not active, the "vbn" and "vbn1" nodes see a significant disturbance which takes a very long time to settle out. This feature significantly limits the maximum operating frequency of the charge pump. It is possible to more quickly settle the disturbance at the "vbn" and "vbn1" nodes by other means, but this requires much more power to be provided to the bias block. The dummy charge pump of the present invention eliminates the necessity of providing additional power by eliminating the source of the disturbances.

While this patent document has described certain embodiments and methods of the invention, it is understood that alterations and permutations of these embodiments and methods will be apparent to those skilled in the art. Accordingly, the above description of exemplary embodiments does not define or constrain the disclosure set forth in this patent document. Other changes, substitutions, and alterations are also possible without departing from the spirit and scope of this disclosure, as defined by the following claims.

What is claimed is:

1. A charge pump circuit comprising:

a pump up circuit comprising a first p-type metal oxide semiconductor (PMOS) transistor and a second p-type metal oxide semiconductor (PMOS) transistor coupled together in a cascode configuration, said pump up circuit configured for providing a pump up current as an output; and said first p-type metal oxide semiconductor (PMOS) transistor having a source that is connected to an up control signal;

a first kicker capacitor coupled to said pump up circuit, said first kicker capacitor having a first end directly connected to a drain of said first p-type metal oxide semiconductor (PMOS) transistor, said first kicker capacitor directly connected to a source of said second p-type metal oxide semiconductor (PMOS) transistor, said first kicker capacitor having a second end directly connected to an inverter, said inverter connected to said up control signal, said up control signal directly connected to a second inverter, and said second inverter connected to said source of said first p-type metal oxide semiconductor (PMOS) transistor;

said first kicker capacitor configured for one of: adding electrical charge to and removing electrical charge from said pump up circuit.

2. The charge pump circuit as claimed in claim 1 wherein said first kicker capacitor has a capacitance that is sufficient to produce a sharp rise/fall time with one of: a symmetrical overshoot/undershoot and a minimum overshoot/undershoot.

3. The charge pump circuit as claimed in claim 1 further comprising:
control circuitry coupled to said pump up circuit and to said first kicker capacitor, wherein said control circuitry is configured for controlling one of: a charging of said first kicker capacitor and a discharging of said first kicker capacitor.

4. The charge pump circuit as claimed in claim 3 wherein said control circuitry is configured for receiving a control signal and in response to receiving said control signal is configured for causing said first kicker capacitor to one of: (1) charge a gate to source capacitance (CGS) of said pump up circuit of said charge pump circuit, and (2) discharge a gate to source capacitance (CGS) of said pump up circuit of said charge pump circuit.

5. The charge pump circuit as claimed in claim 1 further comprising:
a pump down circuit comprising a first n-type metal oxide semiconductor (NMOS) transistor and a second n-type metal oxide semiconductor (NMOS) transistor coupled together in a cascode configuration, said pump down circuit configured for providing a pump down current as an output; and
said first n-type metal oxide semiconductor (NMOS) transistor having a source that is directly connected to a down control signal;
a second kicker capacitor coupled to said pump down circuit, said second kicker capacitor having a first end directly connected to a drain of said first n-type metal oxide semiconductor (NMOS) transistor and directly connected to a source of said second n-type metal oxide semiconductor (NMOS) transistor, said second kicker capacitor having a second end connected to said down control signal that is connected to said source of said first n-type metal oxide semiconductor (NMOS) transistor;
said second kicker capacitor configured for one of: adding electrical charge to and removing electrical charge from said pump down circuit.

6. The charge pump circuit as claimed in claim 5 wherein said second kicker capacitor has a capacitance that is sufficient to produce a sharp rise/fall time with one of: a symmetrical overshoot/undershoot and a minimum overshoot/undershoot.

7. The charge pump circuit as claimed in claim 5 further comprising:
control circuitry coupled to said pump down circuit and to said second kicker capacitor, wherein said control circuitry is configured for receiving a control signal and in response to receiving said control signal is configured for causing said second kicker capacitor to one of: (1) charge a gate to source capacitance (CGS) of said pump down circuit of said charge pump circuit, and (2) discharge a gate to source capacitance (CGS) of said pump down circuit of said charge pump circuit.

8. A phase locked loop circuit, comprising:
a loop filter configured for storing a voltage;
an oscillator configured for generating an output signal having a frequency based on the loop filter voltage;
a frequency divider configured for receiving the output signal and generating an altered output signal;
a phase-frequency detector configured for receiving an input signal and the altered output signal, comparing the input signal and the altered output signal, and generating control signals based on the comparison; and
a charge pump circuit configured for receiving the control signals and sourcing a first current to the loop filter and draining a second current from the loop filter based on the control signals, wherein the charge pump circuit comprises:
a pump up circuit comprising a first p-type metal oxide semiconductor (PMOS) transistor and a second p-type metal oxide semiconductor (PMOS) transistor coupled together in a cascode configuration, said pump up circuit configured for providing a pump up current as an output; and
said first p-type metal oxide semiconductor (PMOS) transistor having a source that is connected to an up control signal;
a first kicker capacitor coupled to said pump up circuit, said first kicker capacitor having a first end directly connected to a drain of said first p-type metal oxide semiconductor (PMOS) transistor, said first kicker capacitor directly connected to a source of said second p-type metal oxide semiconductor (PMOS) transistor, said first kicker capacitor having a second end directly connected to an inverter, said inverter connected to said up control signal, said up control signal directly connected to a second inverter, and said second inverter connected to said source of said first p-type metal oxide semiconductor (PMOS) transistor;
said first kicker capacitor configured for one of: adding electrical charge to and removing electrical charge from said pump up circuit.

9. The phase locked loop circuit as claimed in claim 8 wherein said first kicker capacitor has a capacitance that is sufficient to produce a sharp rise/fall time with one of: a symmetrical overshoot/undershoot and a minimum overshoot/undershoot.

10. The phase locked loop circuit as claimed in claim 8 wherein said charge pump circuit further comprises:
control circuitry coupled to said pump up circuit and to said first kicker capacitor, wherein said control circuitry is configured for controlling one of: a charging of said first kicker capacitor and a discharging of said first kicker capacitor.

11. The phase locked loop circuit as claimed in claim 10 wherein said control circuitry of said charge pump circuit is configured for receiving a control signal and in response to receiving said control signal is configured for causing said first kicker capacitor to one of (1) charge a gate to source capacitance (CGS) of said pump up circuit of said charge pump circuit, and (2) discharge a gate to source capacitance (CGS) of said pump up circuit of said charge pump circuit.

12. The phase locked loop circuit as claimed in claim 8 wherein said charge pump circuit further comprises:
a pump down circuit comprising a first n-type metal oxide semiconductor (NMOS) transistor and a second n-type metal oxide semiconductor (NMOS) transistor coupled together in a cascode configuration, said pump down circuit configured for providing a pump down current as an output; and
said first n-type metal oxide semiconductor (NMOS) transistor having a source that is directly connected to a down control signal;
a second kicker capacitor coupled to said pump down circuit, said second kicker capacitor having a first end directly connected to a drain of said first n-type metal oxide semiconductor (NMOS) transistor and directly connected to a source of said second n-type metal oxide semiconductor (NMOS) transistor, said second kicker capacitor having a second end connected to said down control signal that is connected to said source of said first n-type metal oxide semiconductor (NMOS) transistor;

said second kicker capacitor configured for one of: adding electrical charge to and removing electrical charge from said pump down circuit.

13. The phase locked loop circuit as claimed in claim 12 wherein said second kicker capacitor has a capacitance that is sufficient to produce a sharp rise/fall time with one of: a symmetrical overshoot/undershoot and a minimum overshoot/undershoot.

14. The phase locked loop circuit as claimed in claim 12 wherein said charge pump circuit further comprises:

control circuitry coupled to said pump down circuit and to said second kicker capacitor, wherein said control circuitry is configured for receiving a control signal and in response to receiving said control signal is configured for causing said second kicker capacitor to one of: (1) charge a gate to source capacitance (CGS) of said pump down circuit of said charge pump circuit, and (2) discharge a gate to source capacitance (CGS) of said pump down circuit of said charge pump circuit.

15. An apparatus comprising:

an interface capable of configured for at least one of: transmitting data and receiving data; and a transceiver configured for at least one of: up-converting the data to be transmitted and down-converting the data received, the transceiver comprising a phase locked loop having a loop filter and a charge pump circuit configured for sourcing a first current to the loop filter and draining a second current from the loop filter, wherein said charge pump circuit comprises:

a pump up circuit comprising a first p-type metal oxide semiconductor (PMOS) transistor and a second p-type metal oxide semiconductor (PMOS) transistor coupled together in a cascode configuration, said pump up circuit configured for providing a pump up current as an output; and said first p-type metal oxide semiconductor (PMOS) transistor having a source that is directly connected to an up control signal;

a first kicker capacitor coupled to said pump up circuit, said first kicker capacitor having a first end directly connected to a drain of said first p-type metal oxide semiconductor (PMOS) transistor, said first kicker capacitor directly connected to a source of said second p-type metal oxide semiconductor (PMOS) transistor, said first kicker capacitor having a second end directly connected to an inverter, said inverter connected to said up control signal, said up control signal directly connected to a second inverter, and said second inverter connected to said source of said first p-type metal oxide semiconductor (PMOS) transistor;

said first kicker capacitor configured for one of: adding electrical charge to and removing electrical charge from said pump up circuit.

16. The apparatus as claimed in claim 15 wherein said first kicker capacitor has a capacitance that is sufficient to produce a sharp rise/fall time with one of: a symmetrical overshoot/undershoot and a minimum overshoot/undershoot.

17. The apparatus as claimed in claim 15 wherein said charge pump circuit further comprises:

control circuitry coupled to said pump up circuit and to said first kicker capacitor, wherein said control circuitry is configured for controlling one of: a charging of said first kicker capacitor and a discharging of said first kicker capacitor.

18. The apparatus as claimed in claim 17 wherein said control circuitry of said charge pump circuit is configured for receiving a control signal and in response to receiving said control signal is configured for causing said first kicker capacitor to one of: (1) charge a gate to source capacitance (CGS) of said pump up circuit of said charge pump circuit, and (2) discharge a gate to source capacitance (CGS) of said pump up circuit of said charge pump circuit.

19. The apparatus as claimed in claim 15 wherein said charge pump circuit further comprises:

a pump down circuit comprising a first n-type metal oxide semiconductor (NMOS) transistor and a second n-type metal oxide semiconductor (NMOS) transistor coupled together in a cascode configuration, said pump down circuit configured for providing a pump down current as an output; and said first n-type metal oxide semiconductor (NMOS) transistor having a source that is directly connected to a down control signal;

a second kicker capacitor coupled to said pump down circuit, said second kicker capacitor having a first end directly connected to a drain of said first n-type metal oxide semiconductor (NMOS) transistor and directly connected to a source of said second n-type metal oxide semiconductor (NMOS) transistor, said second kicker capacitor having a second end connected to said down control signal that is connected to said source of said first n-type metal oxide semiconductor (NMOS) transistor;

said second kicker capacitor configured for one of: adding electrical charge to and removing electrical charge from said pump down circuit.

20. The apparatus as claimed in claim 19 wherein said second kicker capacitor has a capacitance that is sufficient to produce a sharp rise/fall time with one of: a symmetrical overshoot/undershoot and a minimum overshoot/undershoot.

21. The apparatus as claimed in claim 15 wherein said charge pump further comprises:

control circuitry coupled to said pump down circuit and to said second kicker capacitor, wherein said control circuitry is configured for receiving a control signal and in response to receiving said control signal is configured for causing said second kicker capacitor to one of: (1) charge a gate to source capacitance (CGS) of said pump down circuit of said charge pump circuit, and (2) discharge a gate to source capacitance (CGS) of said pump down circuit of said charge pump circuit.

* * * * *